(12) United States Patent
McClure

(10) Patent No.: US 7,825,704 B2
(45) Date of Patent: Nov. 2, 2010

(54) THRESHOLD PERSONALIZATION TESTMODE

(75) Inventor: David McClure, Carrollton, TX (US)

(73) Assignee: STMicroelectronics, Inc., Carrollton, TX (US)

(*) Notice: Subject to any disclaimer, the term of this patent is extended or adjusted under 35 U.S.C. 154(b) by 812 days.

(21) Appl. No.: 11/733,081

(22) Filed: Apr. 9, 2007

(65) Prior Publication Data

US 2007/0236268 A1 Oct. 11, 2007

Related U.S. Application Data

(60) Provisional application No. 60/744,563, filed on Apr. 10, 2006.

(51) Int. Cl.
*H03M 1/78* (2006.01)
(52) U.S. Cl. .................... 327/142; 327/540; 327/143; 327/155; 327/535; 257/48; 324/765; 341/154
(58) Field of Classification Search ............ 327/142, 327/143, 155–160, 534–537, 540–546; 341/145, 341/154; 324/765; 257/48
See application file for complete search history.

(56) References Cited

U.S. PATENT DOCUMENTS 7,345,611 B2* 3/2008 Voicu et al. .................. 341/145
7,639,067 B1* 12/2009 Perisetty ...................... 327/537

* cited by examiner

*Primary Examiner*—Michael B Shingleton
(74) *Attorney, Agent, or Firm*—Lisa K. Jorgenson; William J. Kubida

(57) ABSTRACT

A threshold personalization circuit for a reset or supervisor chip includes personalization fuses, which shift a resistor divider to provide a variety of selectable voltage thresholds. The personalization fuses may provide hundreds of millivolts of adjustment. The threshold personalization circuit further includes trim fuses to fine tune the threshold to within a few millivolts of the target threshold voltage. The threshold personalization circuit includes a test mode to cycle through to a particular personalization trim, such that at prelaser testing the personalized value is found (the fuse blow for personalization is emulated) and then the trim fuse amount can be based on the actual final personalized voltage. This results in very accurate threshold voltages for all personalized values.

17 Claims, 2 Drawing Sheets

TEST MODE SHIFT REGISTER

US 7,825,704 B2

THRESHOLD PERSONALIZATION TESTMODE

RELATED APPLICATION

The present application claims priority from U.S. Provisional Application No. 60/744,563, filed Apr. 10, 2006. The disclosure of the foregoing United States Patent Application is specifically incorporated herein by this reference in its entirety.

BACKGROUND OF THE INVENTION

The present invention relates to a circuit and method to accurately predict which fuses to blow to meet a particular voltage threshold suitable for use in reset chips, supervisor chips, and the like.

One problem for such chips is that some devices have a number of thresholds, varying over a wide range. For example, from 1.6V to 4.6V. One device can have as many as 24 different threshold offerings. It is difficult to provide one chip that can accurately provide so many different threshold offerings while remaining cost effective to produce.

What is desired, therefore, is a cost effective circuit and method that can provide a selectable, accurate voltage threshold for use in a reset or supervisor chip.

SUMMARY OF THE INVENTION

According to an embodiment of the invention a threshold personalization circuit for a reset or supervisor chip includes personalization fuses, which shift a resistor divider to provide a plurality of main trip points. The threshold personalization circuit of the present invention further comprises trim fuses to fine tune the threshold to within a few millivolts of the target threshold voltage. The personalization fuses may provide hundreds of millivolts of adjustment. During testing, a default threshold exists (before any fuses are blown). According to an embodiment of the present invention, the default threshold may be set to 4.6 volts, for example. The chip would be tested at a 4.6 volt threshold and trimmed accordingly. For a particular application, however, the threshold may be 1.6 volts, for example. In this case, a personalization fuse (in addition to the trim fuse) needs to is blown. The amount of trim needed to achieve a 4.6 volt threshold is not necessarily the same as the amount of trim required for a 1.6 volt threshold. This is because the resistor divider varies slightly over voltage. The method of the present invention includes a test mode to cycle through the particular personalization trim, such that at prelaser testing the personalized value is found (the fuse blow for personalization is emulated) and then the trim fuse amount can be based on the actual final personalized voltage. This results in very accurate threshold voltages for all personalized values.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
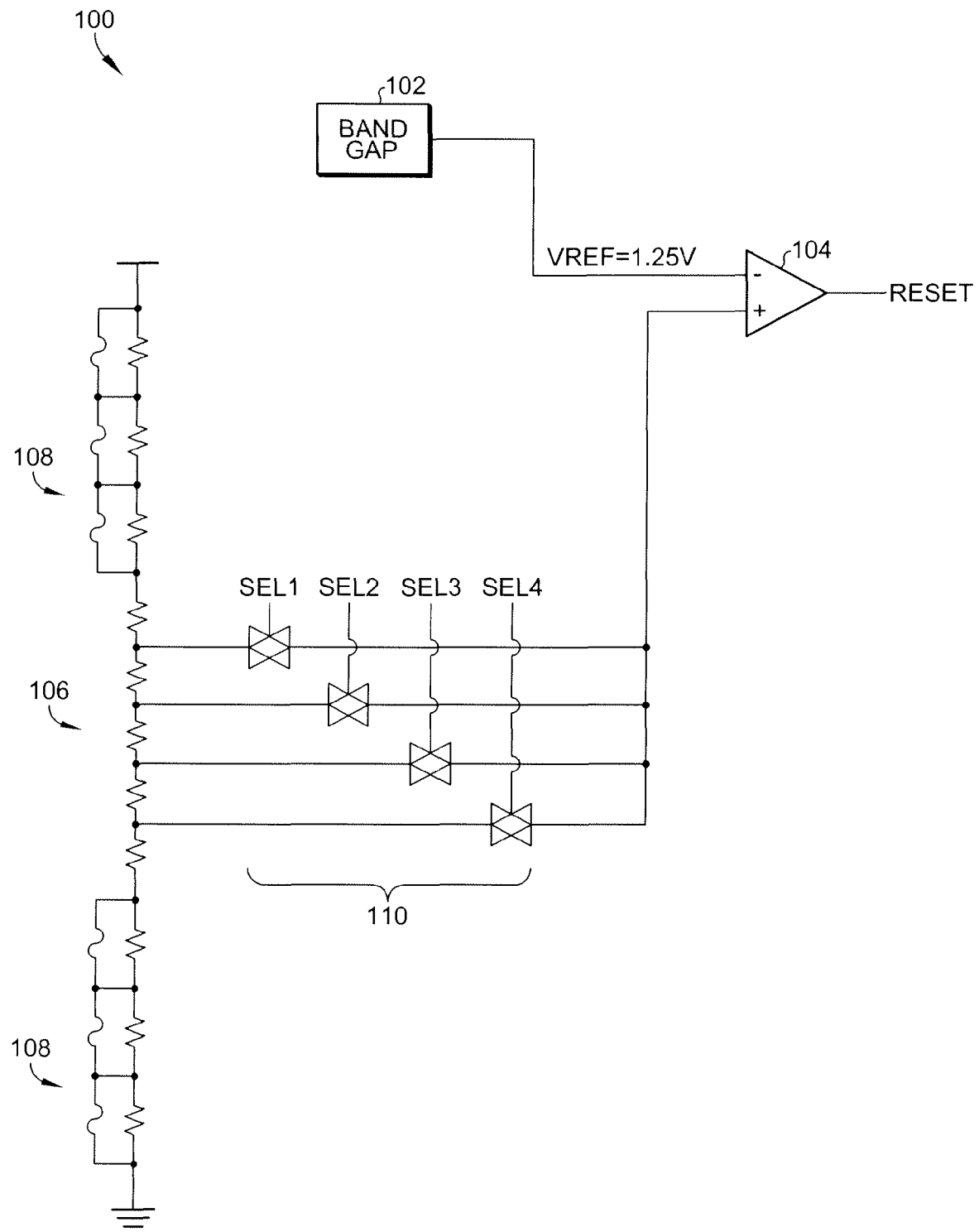
FIG. 1 is a schematic/block diagram of a first circuit portion of the present invention including a resistor divider and trim fuses, a selectable passgate circuit including four selectable passgates, a bandgap reference voltage circuit, and a comparator for providing a reset signal.

FIG. 1 shows a first portion 100 of the circuit of the present invention including a bandgap reference voltage circuit 102. Bandgap circuits are well known in the art and many different bandgap designs can be used based upon the requirements of a particular application. Bandgap reference voltage circuit 102 generates a voltage that is constant over temperature of about 1.25 volts. The circuit 102 shown in FIG. 1 is an one example of a bandgap circuit and its exact implementation details are not critical to the method and circuit of the present invention, and other known circuits can be used. The output is labeled VREF and is about 1.25 volts. As is known in the art, bandgap circuit 102 can be designed to include current source outputs to be provided to other circuits, such as comparators, and the like. As is also known in the art, bandgap circuit 102 can be designed to include a startup circuit as bandgap circuits are known to have two stable states, one of which is not operational.

Figure 2:
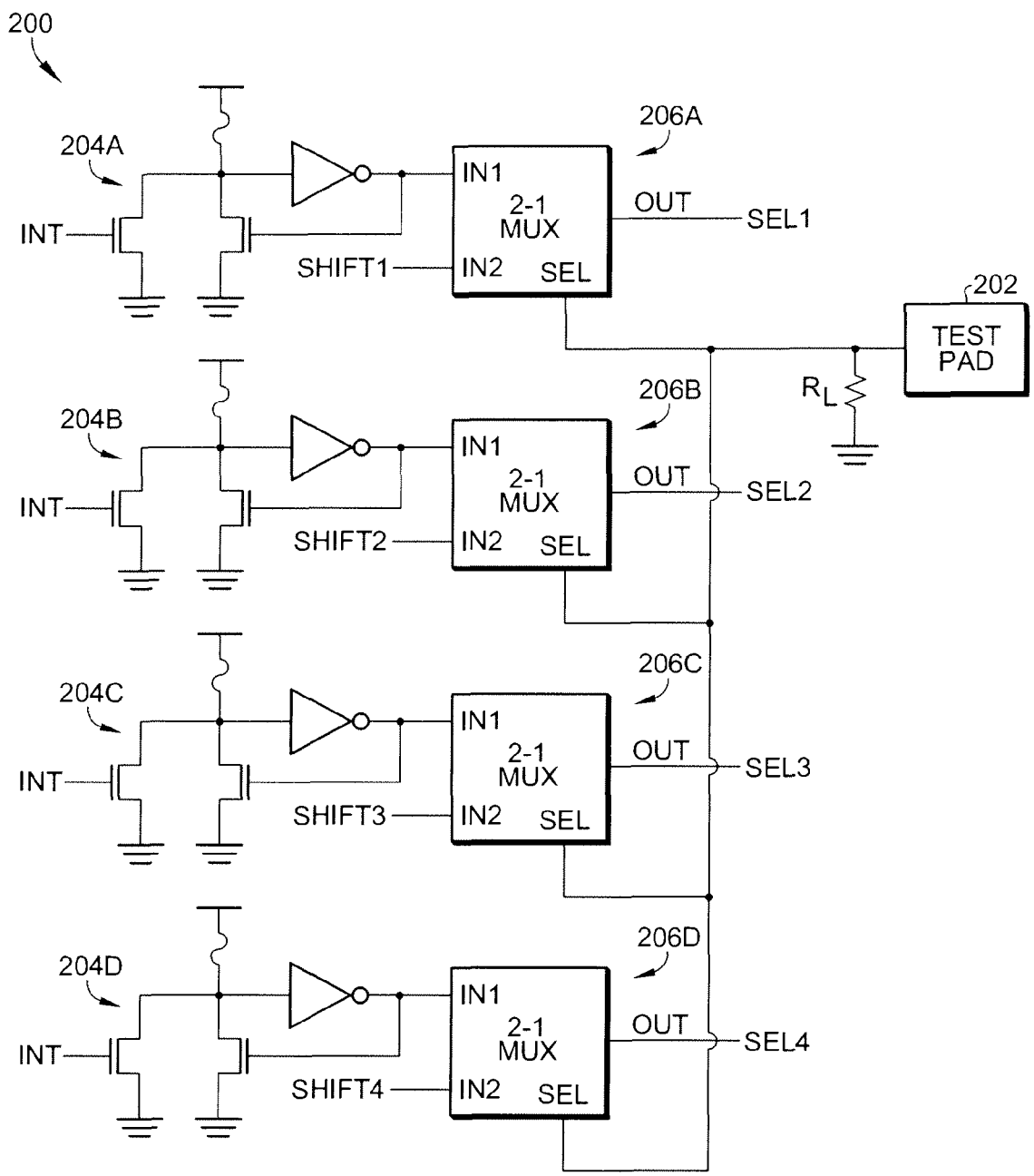
FIG. 2 is a schematic/block diagram of a second circuit portion of the present invention including four personalization fuse circuits that are coupled to four corresponding two-to-one multiplexers for providing selection signals to the selectable passgate circuit, a test pad for receiving a test mode signal coupled to the multiplexers, and a load resistor coupled to the test pad.

FIG. 1 also includes a comparator 104 having a negative input for receiving the VREF reference voltage from the bandgap circuit 102, a positive output that is selectively coupled to a resistor divider 106 through selectable passgate circuitry 110 as is explained in further detail below, and an output for providing the RESET output signal. The exact implementation detail of comparator 104 of FIG. 2 is not critical to the method and circuit of the present invention, and many types of comparator circuits can be used for the particular implementation of comparator 104.

FIG. 1 further shows a segmented resistor divider 106, according to the present invention. Resistor divider is coupled between VCC and ground. Resistor divider 106 includes a middle segmented portion of resistors having multiple output taps. In the example of FIG. 1, four such output taps can be seen. Resistor divider 106 also includes upper and lower segmented portions 108, wherein the resistors are each in parallel with individual trim fuses. The trim fuses at the top and bottom 108 of the resistor divider 106 are used to provide the fine trim up and trim down capability, respectively. The four taps off the resistor are the personalization taps (and the associated hysteresis taps). These taps feed into the personalization selection circuit shown in greater detail in FIG. 2.

Hysteresis is provided by the circuit of FIG. 1. Each one of the SEL passgates are actually a pair of passgates, that tap into two different points on the resistor, for example 20 mv or 50 mv apart (for a 20 mv or 50 mv hysteresis). The RESET output (output of the comparator) controls which of the pair of passgates is conducting, hence providing hysteresis.

Finally, FIG. 1 includes the selectable passgate circuitry 110, previously referred to. FIG. 1 shows four individual passgates, each passgate being controlled by a separate digital control signal labeled SEL1, SEL2, SEL3, and SEL4. Each passgate can be any type required by a particular application. Passgates can include P-channel transistors, N-channel transistors, or a combination of P-channel transistors, N-channel transistors and diodes as is known in the art. The passgate circuitry 110 is used to selectively couple the output voltages on the various resistor divider taps to the positive input of comparator 104. The passgate circuitry 110 is used to select amongst many personalization options such that a particular desired voltage threshold required by a specific application can be implemented.

Figure 3:
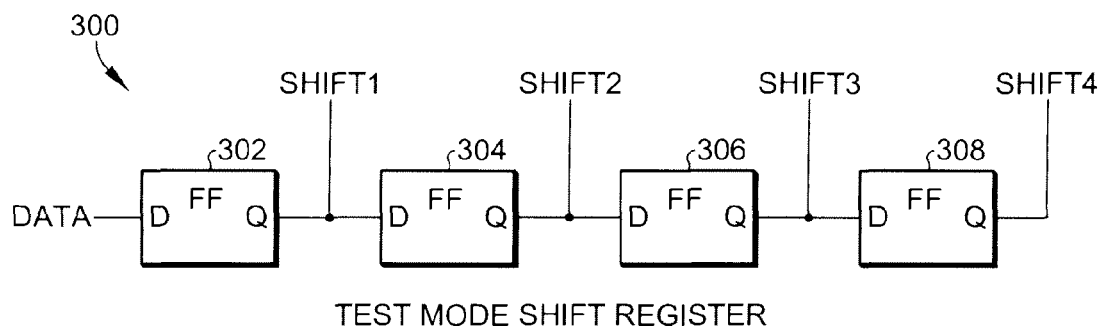
FIG. 3 is a schematic/block diagram of a third circuit portion of the present invention including a test mode shift register circuit comprising four D-type flip-flops in serial connection having an input for receiving a data input signal, and four output for providing four shift signals to the multiplexers.

FIG. 2 contains multiplexing circuitry 200, including passgates on the right, that select one of the many personalization options. Multiplexers 206A, 206B, 206C, and 206D are all two-to-one multiplexers having a first input coupled to personalization fuse circuitry 204A, 204B, 204C, and 204D, and a second input coupled a testmode shift register 300 shown in FIG. 3. Both the personalization fuse circuitry and the testmode shift register are described in further detail below. Muliplexers 206A-206D also include a selection input controlled by the state of the logic signal found on test pad 202. The selection inputs of all of the multiplexers is also coupled to a load resistor $R_L$.

The test mode shift register 300 includes four serially coupled D-type flip-flops 302, 304, 306, and 308. The "D" input of flip-flop 302 receives the input DATA signal, and each of the outputs of flip-flops 302-308 provide the SHIFT1, SHIFT2, SHIFT3, and SHIFT4 output signals. The SHIFT1-SHIFT4 output signals are received by the second input of multiplexers 206A-206D. Shift register 300 shown in FIG. 3 allows clocking through all of the personalization options, stopping at the one of interest for the voltage threshold required, and thereafter measuring the threshold based on the personalization option selected. Then, the correct trim fuses can be blown for resistor divider 106 shown in FIG. 1. The testmode is entered by bringing a logic high signal on test bondpad 202 (not bonded in the package). The pad is tied low via a load resistor $R_L$. When the voltage on the test pad is low, normal operation occurs and the personalization is controlled by the fuse circuitry.

FIG. 2 shows the personalization fuse circuits 204A, 204B, 204C, and 204D that control the generation of the SEL1, SEL2, SEL3, and SEL4 signals. Each circuit is the same and so only one will be described. Personalization fuse circuit 204A includes a fuse, a first transistor having a gate for receiving an INT signal, an inverter, and a second transistor having a gate controlled by the output of the inverter. The INT signal is an initialization signal that is generated on power up (power on reset). It is a pulsed signal that is generated when VCC rises above a certain threshold. In the example of FIG. 2, the fuse is coupled between VCC on one end, and the two transistors and inverter on the other end. When the fuse is blown, the output signal of the inverter is a logic high. When the fuse is intact, the output signal of the inverter is a logic low. The fuse in the personalization fuse circuit can be blown by a laser as is known in the art. The output of the inverter is coupled to the first input of multiplexer 206A.

There are passgates/transmission gates connected between these sets of trim up and trim down fuses. The conducting passgate determines the threshold personalization. The passgates are formed in pairs, with the additional pass-gate being used for hysteresis. Once the threshold is reached, the output of the comparator turns off the conducting passgate and turns on it's "pair", which is about 20 mV higher. Thus, to switch back the other way, VCC with have to go 20 mV higher than the threshold reached when VCC was falling (hence hysteresis, to avoid noise and oscillations).

While there have been described above the principles of the present invention in conjunction with specific implementations and device processing technology, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A threshold personalization circuit comprising:
   a segmented resistor divider coupled between a source of power supply and ground;
   a plurality of trim fuses coupled to segments of the resistor divider;
   a plurality of passgates coupled to the segmented resistor divider, each passgate receiving a selection signal; and
   a comparator having a first input coupled to the plurality of passgates, a second input for receiving a reference voltage, and an output for providing a reset signal,
   wherein the selection signals are provided by a personalization fuse circuit comprising:
   a first multiplexer and fuse circuit for providing a first selection signal;
   a second multiplexer and fuse circuit for providing a second selection signal;
   a third multiplexer and fuse circuit for providing a third selection signal; and
   a fourth multiplexer and fuse circuit for providing a fourth selection signal,
   wherein the multiplexers are controlled by a test mode signal received at a test pad.

2. The threshold personalization circuit of claim 1 wherein the segmented resistor divider comprises:
   a first segmented portion in parallel with a first plurality of trim fuses;
   a second segmented portion; and
   a third segmented portion in parallel with a second plurality of trim fuses.

3. The threshold personalization circuit of claim 2 wherein the first plurality of trim fuses comprises six trim fuses.

4. The threshold personalization circuit of claim 2 wherein the second plurality of trim fuses comprises eight trim fuses.

5. The threshold personalization circuit of claim 1 wherein the plurality of passgates comprises:
   a first passgate for receiving a first selection signal;
   a second passgate for receiving a second selection signal;
   a third passgate for receiving a third selection signal; and
   a fourth passgate for receiving a fourth selection signal.

6. The threshold personalization circuit of claim 5 wherein a second end of the first, second, third, and fourth passgates is coupled to a positive input of the comparator.

7. The threshold personalization circuit of claim 1 wherein each of the first, second, third, and fourth multiplexer and fuse circuits comprises:
- a personalization fuse having a first end coupled to the source of supply voltage;
- a first transistor having a current path coupled between a second end of the personalization fuse and ground, and a gate for receiving a control signal;
- a second transistor having a current path coupled between the second end of the personalization fuse and ground, and a gate;
- an inverter having an input coupled to the second end of the personalization fuse and an output coupled to the gate of the second transistor; and
- a multiplexer having a first input coupled to the output of the inverter, a second input for receiving a shift signal, and a select input for receiving a test pad signal.

8. The threshold personalization circuit of claim 7 wherein the shift signals are provided by a test mode shift register circuit.

9. The threshold personalization circuit of claim 8 wherein the test mode shift register circuit comprises a plurality of serially-coupled flip-flops having an input for receiving a data signal and a plurality of outputs for providing the shift signals.

10. The threshold personalization circuit of claim 1 wherein the reference voltage is substantially constant with respect to temperature.

11. The threshold personalization circuit of claim 1 wherein the reference voltage comprises a bandgap voltage.

12. A threshold personalization circuit comprising:
- a trimmable resistor divider coupled between a source of power supply and ground;
- a selectable passgate circuit having a first end coupled to the resistor divider, a second end, and a selection input;
- a selectable personalization fuse circuit for providing at least one selection signal to the selection input of the selectable passgate circuit; and
- a comparator having a first input coupled to the second end of the selectable passgate circuit, a second input for receiving a reference voltage, and an output for providing a reset signal,
- wherein the selectable personalization fuse circuit comprises a plurality of multiplexers coupled to a plurality of personalization fuse circuits, wherein the multiplexers are controlled by a test mode signal received on a test pad.

13. The threshold personalization circuit of claim 12 wherein the trimmable resistor divider comprises:
- a first segmented portion in parallel with a first plurality of trim fuses;
- a second segmented portion; and
- a third segmented portion in parallel with a second plurality of trim fuses.

14. The threshold personalization circuit of claim 12 wherein the selectable passgate circuit comprises:
- a first passgate for receiving a first selection signal;
- a second passgate for receiving a second selection signal;
- a third passgate for receiving a third selection signal; and
- a fourth passgate for receiving a fourth selection signal.

15. The threshold personalization circuit of claim 12 wherein each of the personalization fuse circuits comprises:
- a personalization fuse having a first end coupled to the source of supply voltage;
- a first transistor having a current path coupled between a second end of the personalization fuse and ground, and a gate for receiving a control signal;
- a second transistor having a current path coupled between the second end of the personalization fuse and ground, and a gate; and
- an inverter having an input coupled to the second end of the personalization fuse and an output coupled to the gate of the second transistor.

16. The threshold personalization circuit of claim 12 further comprising a test mode shift register circuit for providing shift signals to an input of the multiplexers.

17. A method of providing a reset signal comprising:
- in a test mode for an integrated circuit, sensing a power supply voltage with a resistor divider and providing a plurality of tap points;
- selecting one of the tap points with a selectable personalization fuse circuit;
- trimming the resistor divider; and
- comparing the selected tap point to a reference voltage to provide the reset signal,
- wherein the selectable personalization fuse circuit comprises a plurality of multiplexers coupled to a plurality of personalization fuse circuits, wherein the multiplexers are controlled by a test mode signal received on a test pad.

* * * * *